United States Patent [19]
Dalal et al.

[11] Patent Number: 5,981,374
[45] Date of Patent: Nov. 9, 1999

[54] SUB-HALF-MICRON MULTI-LEVEL INTERCONNECTION STRUCTURE AND PROCESS THEREOF

[75] Inventors: Hormazdyar M. Dalal, Milton, N.Y.; Du Binh Nguyen, Danbury, Conn.; Hazara S. Rathore, Stormville, N.Y.

[73] Assignee: International Business Machines Corporation, Armonk, N.Y.

[21] Appl. No.: 08/841,221

[22] Filed: Apr. 29, 1997

[51] Int. Cl.$^6$ .................................................. H01L 21/441
[52] U.S. Cl. ......................... 438/624; 438/625; 438/637
[58] Field of Search ................................. 438/618, 622, 438/624, 627, 637, 625, 631, 642, 643, 645, 648, 652, 653, 656, 675, 683, 688, FOR 349, FOR 350, FOR 352, FOR 354, FOR 355, 700, 702

[56] References Cited

U.S. PATENT DOCUMENTS

| | | |
|---|---|---|
| 3,837,907 | 9/1974 | Berglund et al. ........................ 117/212 |
| 4,309,812 | 1/1982 | Horng et al. ............................... 29/578 |
| 4,482,841 | 11/1984 | Tiku et al. ................................ 313/503 |
| 4,764,484 | 8/1988 | Mo . |
| 5,252,516 | 10/1993 | Nguyen et al. .......................... 437/195 |
| 5,326,426 | 7/1994 | Tam et al. ................................. 156/643 |
| 5,371,047 | 12/1994 | Greo et al. . |
| 5,403,779 | 4/1995 | Joshi et al. ............................... 437/190 |
| 5,404,635 | 4/1995 | Das ............................................. 29/603 |
| 5,434,451 | 7/1985 | Dalal et al. .............................. 257/768 |
| 5,466,639 | 11/1995 | Ireland .................................... 437/195 |
| 5,488,015 | 1/1996 | Havemann et al. . |
| 5,518,963 | 5/1996 | Park ......................................... 437/195 |
| 5,817,572 | 10/1998 | Chiang et al. .......................... 438/624 |
| 5,840,619 | 11/1998 | Hayashide .............................. 438/624 |
| 5,840,624 | 11/1998 | Jang et al. ............................... 438/624 |

*Primary Examiner*—Mary Wilczewski
*Attorney, Agent, or Firm*—Aziz M. Ahsan

[57] ABSTRACT

The present invention relates to the field of semiconductor manufacturing, and more specifically to methods of forming sub-half-micron multi-level interconnect structures for integrated circuits. The inventive structure and process are spike free and that has resulted in improved circuit performance, reliability and process yields. The inventive structure and process have a plurality of insulator layers where each of the adjoining insulator layers are of a different material.

30 Claims, 5 Drawing Sheets

SUB-HALF-MICRON MULTI-LEVEL INTERCONNECTION STRUCTURE AND PROCESS THEREOF

CROSS-REFERENCE TO RELATED PATENT APPLICATION

This patent application is related to U.S. patent application Ser. No. 08/840,832, filed on Apr. 29, 1997, entitled, "SUB-HALF-MICRON MULTI-LEVEL INTERCONNECTION STRUCTURE", presently assigned to the assignee of the instant application and the disclosure of which is incorporated herein by reference.

FIELD OF THE INVENTION

The present invention relates to the field of semiconductor manufacturing, and more specifically to processes of forming sub-half-micron multi-level interconnect structures for integrated circuits. The inventive structure and process are spike free and that has resulted in improved circuit performance, reliability and process yields.

BACKGROUND OF THE INVENTION

Current interconnection technologies conventionally use tungsten or polysilicon to make contacts to devices and also to act as a short local interconnect lines. These local interconnect lines are then joined to high conductivity interconnection lines (say $M_1$) on a higher plane through tungsten via-plugs. The local interconnects are separated from the $M_1$ layer usually by a layer of phospho-silicate glass (PSG).

The via-interconnection between the first high conductivity metal lines ($M_1$) and the next level of high conductivity metal lines (say $M_2$) is preferably made with the same high conductivity metal instead of tungsten.

Various other schemes for multilevel interconnection, and more particularly for utilization of a composite insulator, are taught in the prior art.

U.S. Pat. No. 3,837,907 (Berglund et al.) and U.S. Pat. No. 4,309,812 (Horng et al.) use a scheme, where composite insulators with different etching characteristics are used to make an overhung structure of insulator layers in order to reduce the spacing between the adjacent features. Berglund uses this scheme to reduce the spacing between the adjacent interconnect metal lines. However, this scheme is limited to metal lines running in any one particular direction which reduces its applicability.

U.S. Pat. No. 4,309,812 (Horng et al.), assigned to the instant assignee, and the disclosure of which is incorporated herein by reference, uses the above scheme to make closely spaced device contacts.

U.S. Pat. No. 5,326,426 (Tam et al.) utilize layers of different insulating material to provide a reflective coating for a laser mask.

U.S. Pat. No. 5,403,779 (Joshi et al.), assigned to the instant assignee, and the disclosure of which is incorporated herein by reference, teaches use of an organic dielectric layer sandwiched between inorganic dielectric layers.

It is well within the experience of artisans in this field that chemical/mechanical polishing of an organic layer produces debris thereby causing defects like metal opens and holes in the next level of dielectric.

U.S. Pat. No. 5,404,635 (Das) teaches use of a single dielectric layer to act as a spacer and an etch stop to fabricate thin film magnetic head.

U.S. Pat. No. 5,252,516 (Nguyen et al.), assigned to the assignee of the instant invention and the disclosure of which is incorporated herein by reference, teaches the use of a composite insulator comprised of a relatively thick layer of a reactively ion etchable dielectric and covered with a thin layer of an dielectric resistant to reactive etching.

U.S. Pat. No. 5,466,639 (Ireland), teaches double mask process for forming trenches and contacts during the formation of a semiconductor memory device. He shows another application of composite insulator to sequentially etch dielectric for the purpose of double damascene. Ireland uses a set of 3 dielectric layers to make cavity which consists of via stud and line patterns. However, the combination of three distinct layers of insulators causes charge trapment and dielectric losses.

U.S. Pat. No. 5,518,963 (Park), discloses a method for forming metal interconnection of semiconductor device. He uses insulating layer to etch a hole in one insulator while the second insulator protects the metal underneath from exposure to harsh etchants of the first insulator.

Artisans in the field of semiconductor integrated circuits are cognizant that multiple dielectric layers not only cause process complications and cost increase but more significantly it impedes the device functionality due to increased capacitance.

Thus, despite repeated efforts, and various schemes in the prior art, problems of leakage, short circuits, process yield, electromigration failure etc., remain and better methods, necessarily with simpler and fewer process steps, for making an integrated circuit pattern need to be developed.

PURPOSES AND SUMMARY OF THE INVENTION

The invention is a novel process and an apparatus for forming sub-half-micron multi-level interconnect structures for integrated circuits.

Therefore, one purpose of this invention is to provide an apparatus and a process that will provide a process for fabricating an interconnection circuitry of sub-half-micron dimension with improved process yield, reliability and circuit performance.

Another purpose of this invention is to provide an interconnection process to prevent formation of undesired metal spikes.

Still another purpose of this invention is to prevent inter level short, or reliability exposing metal spike, caused by misalignment during a double damascene process.

Yet another purpose of this invention is to provide a thin etch barrier to prevent accidental etching of the underlying insulator.

Still yet another purpose of the invention is to provide a minimum number of the etch barrier dielectric layers to reduce its effect on capacitance increase.

Therefore, in one aspect this invention comprises a process of forming high electrical conductivity interconnection on a substrate having at least one exposed metallic via-plug surrounded by at least one insulator layer, said process comprising the steps of:

(a) sequentially depositing, at least one first insulator layer over said exposed metallic via-plug and said substrate, and at least one second insulator layer over said first insulator layer, and wherein material for said first insulator layer is different than material for said second insulator layer, (b) defining a pattern for a first level of high electrical conductivity interconnection over said second insulator layer, (c) sequentially etching at least a portion of said second insulator layer, and at least a portion of said first insulator layer, to form at least one opening and to expose at least a portion of said metallic via-plug, (d) depositing at least one high electrical conductivity interconnection to form said first level of high electrical conductivity interconnection within said at least one opening, such that at least a portion of said high electrical conductivity interconnection is in direct electrical contact with at least a portion of said metallic via-plug, and thereby forming said high electrical conductivity interconnection on said substrate.

In another aspect this invention comprises a process of forming multilevel high electrical conductivity interconnection on a substrate having at least one exposed metallic via-plug surrounded by at least one insulator layer, said process comprising the steps of:

(a) sequentially depositing, at least one first insulator layer over said exposed metallic via-plug and said substrate, and at least one second insulator layer over said first insulator layer, and wherein material for said first insulator layer is different than material for said second insulator layer, (b) defining a pattern for a first level of high electrical conductivity interconnection over said second insulator layer, (c) sequentially etching at least a portion of said second insulator layer, and at least a portion of said first insulator layer, to form at least one opening and to expose at least a portion of said metallic via-plug, (d) depositing at least one first high electrical conductivity material to form said first level of high electrical conductivity interconnection line within said at least one opening, such that at least a portion of said first high electrical conductivity interconnection line is in direct contact with at least a portion of said metallic via-plug, (e) sequentially depositing, at least one third insulator layer over said first level of high electrical conductivity interconnection line and said second insulator, and at least one fourth insulator layer over said third insulator layer, and wherein material for said third insulator layer is different than material for said second and said fourth insulator layer, (f) defining a pattern corresponding to at least one first level of high electrical conductivity via-plug over said fourth insulator layer, (g) etching at least a portion of said fourth insulator layer, (h) defining a pattern corresponding to at least one second level of high electrical conductivity metal interconnection line over said fourth insulator layer, (i) sequentially etching at least a portion of said fourth insulator layer, and at least a portion of said third insulator layer, to form at least one combined opening for at least one first level of high electrical conductivity via-plug and at least one second level of high electrical conductivity metal interconnection line, and exposing at least a portion of said first level of high electrical conductivity metal interconnection line, (j) depositing at least one high electrical conductivity interconnection to form an integrated interconnection structure comprised of said first level of high electrical conductivity via-plug and said second level of high electrical conductivity interconnection line within said at least one opening, such that at least a portion of said high electrical conductivity interconnection via-plug is in direct contact with at least a portion of said high electrical conductivity metal interconnection line, and thereby forming said multilevel high electrical conductivity via-plug and interconnection line on said substrate.

In yet another aspect this invention comprises a process of forming multilevel high electrical conductivity interconnection, comprised of via-plug and interconnection lines, on a substrate having at least one exposed metallic via-plug surrounded by at least one insulator layer, said process comprising the steps of:

(a) sequentially depositing, at least one first insulator layer over said exposed metallic via-plug and said substrate, and at least one second insulator layer over said first insulator layer, and wherein material for said first insulator layer is different than material for said second insulator layer, (b) defining a pattern for a first level of high electrical conductivity interconnection over said second insulator layer, (c) sequentially etching at least a portion of said second insulator layer, and at least a portion of said first insulator layer, to form at least one opening and to expose at least a portion of said metallic via-plug, (d) depositing at least one high electrical conductivity material to form said first level of high electrical conductivity interconnection line within said at least one opening, such that at least a portion of said first high electrical conductivity interconnection line is in direct contact with at least a portion of said metallic via-plug, (e) sequentially depositing, at least one third insulator layer over said first level of high electrical conductivity interconnection line and said second insulator layer, and at least one fourth insulator layer over said third insulator layer, and wherein material for said third insulator layer is different than material for said second and said fourth insulator layer, (f) defining a pattern corresponding to at least one first level of high electrical conductivity via-plug over said fourth insulator layer, (g) sequentially etching at least a portion of said fourth insulator layer, and at least a portion of said third insulator layer, to form at least one opening and to expose at least a portion of said first level of high electrical conductivity interconnection line, (h) depositing at least one high electrical conductivity material to form said first level of high electrical conductivity via-plug within said at least one opening, such that at least a portion of said first level of high electrical conductivity via-plug is in direct contact with at least a portion of said first level of high electrical conductivity interconnection line, (i) sequentially depositing, at least one fifth insulator layer over said first level of high conductivity via-plug and said fourth insulator layer, and at least one sixth insulator layer over said fifth insulator layer, and wherein material for said fifth insulator material is different than material for said fourth and said sixth insulator layer, (j) defining a pattern for at least one second level of high electrical conductivity interconnection line over said sixth insulator layer, (k) sequentially etching at least a portion of said sixth and fifth insulator layer, to form at least one opening and to expose at least a portion of said second level of high electrical conductivity interconnection line, (l) depositing at least one high electrical conductivity material to form said second level of high electrical conductivity interconnection line within said at least one opening, such that at least a portion of said second level of high electrical conductivity interconnection line is in direct contact with at least a portion of said first high electrical conductivity via-plug, and thereby forming said multilevel high electrical conductivity interconnection on said substrate.

In still yet another aspect this invention comprises a process of forming multilevel high electrical conductivity interconnection, comprised of via-plug and interconnection lines, on a substrate having at least one exposed metallic via-plug surrounded by at least one insulator layer, said process comprising the steps of:

(a) sequentially depositing, at least one first insulator layer over said exposed metallic via-plug and said substrate, and at least one second insulator layer over said first insulator layer, and wherein material for said first insulator layer is different than material for said second insulator layer, (b) defining a pattern for a first level of high electrical conductivity interconnection over said second insulator layer, (c) sequentially etching at least a portion of said second insulator layer, and at least a portion of said first insulator layer, to form at least one opening and to expose at least a portion of said metallic via-plug, (d) depositing at least one high electrical conductivity material to form said first level of high electrical conductivity interconnection line within said at least one opening, such that at least a portion of said first high electrical conductivity interconnection line is in direct contact with at least a portion of said metallic via-plug, (e) sequentially depositing, at least one third insulator layer over said first level of high electrical conductivity interconnection line and said second insulator layer, and at least one fourth insulator layer over said third insulator layer, and wherein material for said third insulator layer is different than material for said second and said fourth insulator layer, (f) defining a pattern corresponding to at least one first level of high electrical conductivity via-plug over said fourth insulator layer, (g) sequentially etching at least a portion of said fourth insulator layer, and at least a portion of said third insulator layer, to form at least one opening and to expose at least a portion of said first level of high electrical conductivity interconnection line, (h) depositing at least one high electrical conductivity material to form said first level of high electrical conductivity via-plug within said at least one opening, such that at least a portion of said first level of high electrical conductivity via-plug is in direct contact with at least a portion of said first level of high electrical conductivity interconnection line, (i) depositing at least one high electrical conductivity material over said fourth insulator layer and said first level of high electrical conductivity via-plug, such that said material is in electrical contact with at least a portion of said first high electrical conductivity via-plug, (j) defining a pattern for at least one second level of high electrical conductivity interconnection line, (k) reactively ion etching said defined pattern to form said second level of high electrical conductivity interconnection line, and thereby forming said multilevel high electrical conductivity interconnection on said substrate.

In still yet another aspect this invention comprises a semiconductor substrate having at least one high electrical conductivity interconnect, wherein said substrate comprising at least one p/n junction in electrical contact with a metallic via-plug, at least one first insulator layer over said semiconductor substrate and surrounding said first metallic via-plug, at least a portion of at least one first level of high electrical conductivity interconnection line in contact with said first metallic via-plug, wherein a second and a third insulator layer is over said first insulator layer and surrounds said first level electrical interconnection line, at least a portion of at least one second level electrical interconnection in contact with said first level electrical interconnection line through at least one high electrical conductivity via-plug, wherein at least a fourth and a fifth insulator layer is over said third insulator layer and surrounds said second level electrical interconnection line, and wherein each adjoining insulator layer is of a different material, and thereby forming said semiconductor substrate having at least one high electrical conductivity interconnect.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

The present interconnection technologies conventionally use tungsten or polysilicon to make contacts to devices. They also act as short local interconnect lines. These local interconnect lines are then joined to high conductivity interconnection lines, such as, for example, $M_1$ line, which is on a higher plane through via-plugs, such as, tungsten via-plugs. The local interconnects are normally separated from the $M_1$ line, usually by a layer of phospho-silicate glass (PSG).

The via-interconnection between the first high conductivity metal lines ($M_1$) and the next level of high conductivity metal lines, such as, for example, $M_2$ line, is preferably made with the same high conductivity metal instead of tungsten.

Figure 1:
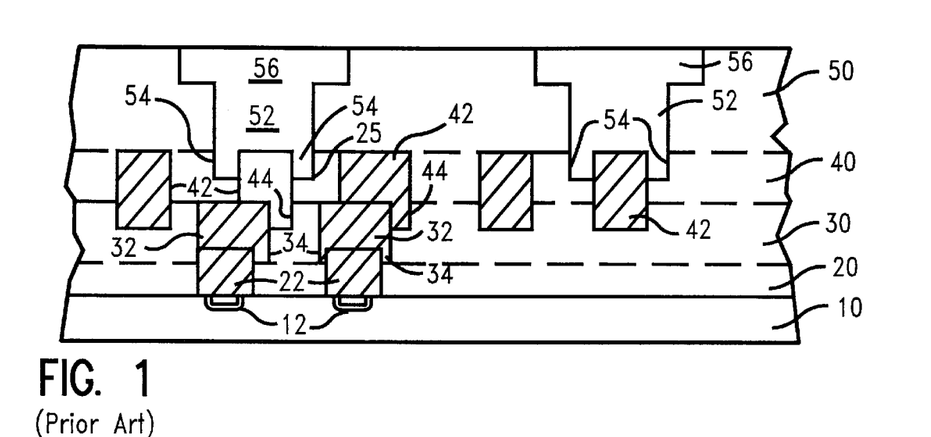
FIG. 1, is a cross-sectional view of a multilevel interconnection tern of prior art, depicting a plurality of metal spikes caused by the process of the prior art.

A cross-section through a portion of a multi-level interconnection of the prior art is shown in FIG. 1. On a silicon substrate 10, devices or p/n junctions 12, are formed. An insulator layer 20, is then formed over the substrate 10, and using prior art methods interconnect or metallic stud 22, are formed. Another insulator layer 30, is then formed over the insulator layer 20. The insulator layer 30, is then etched and the openings are filled to form interconnect or metallic stud 32. Similarly, insulator layers 40 and 50 are formed and are subsequently etched to form interconnects 42, 52 and 56.

Interconnect 22, such as, short interconnects of tungsten 22, make contacts to diffusion contacts 12. Typically, a liner comprised of titanium and titanium-nitride is used as the diffusion contact.

Interconnect 32, which basically comprises of tungsten via-plugs 32, connects interconnects 22, to high conductivity interconnection lines ($M_1$), such as, interconnect lines 42.

Next, $M_1$ lines comprising of line 42, are connected to the $M_2$ lines comprising of line 56, through via-plug or interconnect 52. The via-plugs 52, could be tungsten, but, it is more desirable that the via-plugs 52, are made of high electrical conductivity metal. This is desirable for two reasons: firstly, to avoid the presence of dissimilar metal between high conductivity metals lines, such as, lines $M_1$ and $M_2$, which may impede metal atom flow and that may cause electromigration failure; and secondly, for process cost saving, as the via-plug 52, and the $M_2$ interconnection lines 56, can be simultaneously formed by dual damascene method.

The method for dual damascene is taught by Dalal et al. in U.S. Pat. No. 5,434,451, assigned to the assignee of the present invention and the disclosure of which is incorporated here by reference.

In the damascene method via-plugs, metal lines or a combination of them, are typically formed by first depositing an insulator layer, such as, for example, a $SiO_2$ insulator layer. Patterns are then reactively ion etched to form via-holes, interconnection lines or a combination of via-hole and interconnection lines in this insulator layer. Liner materials can then be deposited and the rest of the holes or trenches can then be filled with metals. The excess metals from the field regions can be removed by chemical-mechanical polishing.

However, this prior art method has a problem of forming metal spikes, such as, metal spikes 34, 44 and 54. The metal spikes 54, are formed when via-studs 52, does not fully land on metal lines 42, due to a variety of reasons, such as, due to a misalignment. Similarly, metal spikes 44, are formed when via-studs 42, do not fully land on metal interconnects 32, due to a variety of reasons, such as, due to a misalignment. And, similarly, metal spikes 34, are formed when via-studs 32, do not fully land on metal interconnects 22, due to a variety of reasons, such as, due to a misalignment.

Another reason for this spiking is that during etching of holes for via-studs an over-etch is generally practiced to ensure complete opening of holes across the wafer. This over-etching results in an undesired blind hole, which is normally formed, and which extends down towards the metal layer that is underneath, such as, the via-stud or interconnect layer. Consequently, metal spikes 34, 44 and 54, are formed when the grooves or over-etched blind holes are filled with the metal, as more clearly seen in FIG. 1.

These metal spikes, such as, metal spikes 44 and 54, are the cause of:

(a) time zero yield degradation due to electrical short between adjacent short channel metal wiring lines, especially around area 25, as shown in FIG. 1, if the metal spike 54, is deep or long enough to contact via-studs 32;

(b) has an exposure to reliability failure due to time dependent leakage generated by the higher electrical field at the tip of the metal spike; and, (c) circuit performance degradation due to increased cross-capacitance between the adjacent lines caused by reduced spacing between the adjacent lines.

Another manifestation of the prior art damascene process is the substantial reduction of the thickness of the high conductivity metal lines overlaying tungsten contact studs, as depicted in FIG. 1. This thickness reduction substantially reduces electromigration life time of high conductivity metal interconnection lines.

However, according to the present invention, a simple and cost effective technique which comprises of unique sequences of process steps is provided which results in interconnection lines that are immune to misalignment, free of deleterious metal spikes, has minimum impact on cross-capacitance, and eliminates the defect with deleterious effect on electromigration.

The invention is generally related to metal filled vias (via-plugs) and either filled or subtractively etched conductor lines on a substrate where the interconnection lines on different vertical levels are separated by a composite of two dielectric layers.

The invention more particularly relates to improvements in sub-half-micron interconnections utilizing an improved double damascene method. It should be understood that the invention is not restricted to any particular metal or dielectric; also, the vias and conductor lines may comprise of same or different metals. Furthermore, it is well known to artisan in the field that metal, as referred here, may be a pure metal, an alloy, or may be comprised of layers of refractory and high electrical conductivity metals or alloys.

Figure 2:
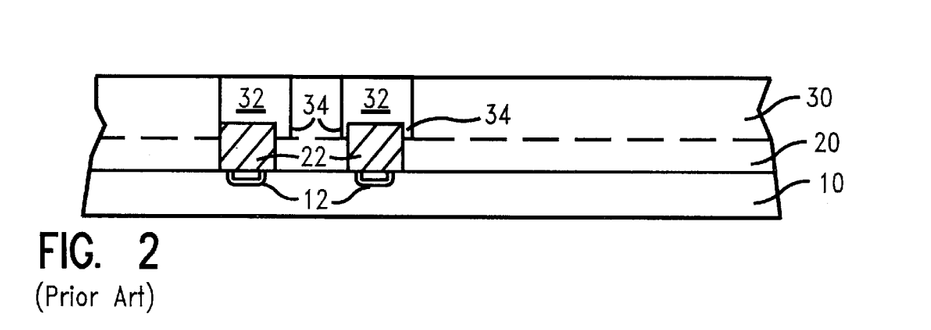
FIG. 2, is a cross-sectional view of a substrate having a plurality of semiconductor devices, metallic via studs, which are tantially planar with the insulator layer, all formed by the process of the prior art.

Referring to the drawings, wherein like reference numerals represent the same or similar parts throughout, and more particularly to FIG. 2, there is shown a cross-section of conventional semiconductor structure comprised of various device contacts and local interconnects or metallic studs 22, typically tungsten with underlayers of titanium and titanium nitride (underlayers not shown), and metallic studs or via-plugs 32. The local interconnects 22, and the via-plugs 32, are formed by damascene methods of prior art.

As shown in FIG. 2, where a pair of insulator layers 20 and 30, defining the short interconnects and via studs pattern are deposited on the surface of the substrate 10. Basically, an insulator layer 20, is first deposited, planarized and then subsequently etched to form opening for metal interconnects. Metal interconnects 22, are then formed in the etched openings in the insulator layer 20. Subsequently, an insulator layer 30, is then deposited and openings for the desired metal interconnects are etched. In order to ensure electrical and mechanical contact, an overetching is done and when the interconnect metal is deposited in the etched opening in the insulator layer 30, one gets interconnect 32, with a spike 34, in the overetching portion of the insulators 20/30.

The excess materials from the metals 22 and 32, which are deposited in the insulator layer 20 and 30, are removed, such as, by Chemical-Mechanical polishing methods of prior art.

It is preferred that the top surfaces of the via-plug 22 and 32, typically, tungsten, are substantially in plane with surface of surrounding insulator layers 20 and 30, respectively. The insulator layers 20 and 30, are typically deposited $SiO_2$ layers. The spikes 34, are formed in the via-plugs 32, and hence, has no deleterious effects of metal thinning as it would be in a metal conductor line; also there is no metal underneath to form a short. The next step is to form high conductivity metal interconnection.

Figure 3:
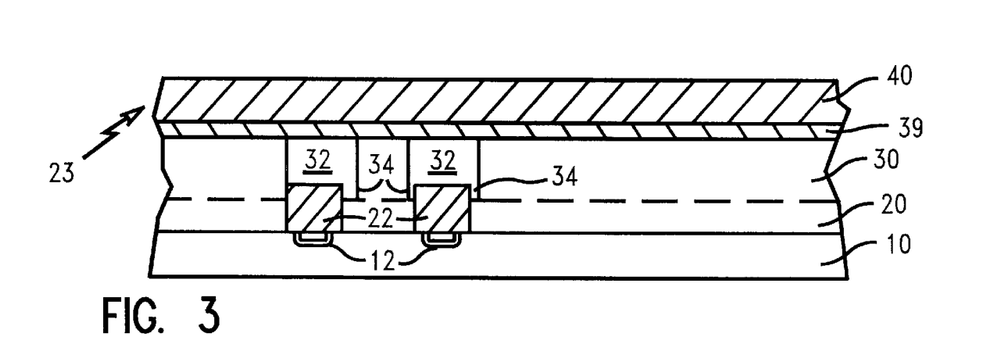
FIG. 3, illustrates a process step of the present invention where a in layer of a first insulator and a thicker layer of second insulator is deposited over the prior art structure of FIG. 2.

The process of this invention is illustrated beginning with FIG. 3. As shown in FIG. 3, a first layer of insulator 39, such as, for example, an insulator selected from a group comprising MgO, $Y_2O_3$ or $Al_2O_{31}$ is first formed over the top surface of insulator 30. Next, a second insulator layer 40, of another insulator type, such as, for example $SiO_2$, is then deposited on the surface of the first insulator 39, forming a dual insulator layer or insulator pair 23. For best results, the material for insulators 39 and 40, are so chosen so as to provide mutually exclusive etching behavior.

It is preferred that the first insulator layer 39, is substantially thinner than the top insulator layer 40.

After the deposition of the insulator pair 23, a definition of interconnection line patterns is then partly etched in the top surface of the dual insulator layer 23, such as, by using photolithography to define patterns for the second high conductivity metal interconnection line. The top insulator layer 40, of the insulator pair 23, is then etched, which is followed by the etching the thin second insulator layer 39. This is more clearly shown in FIG. 4, where the insulator pair 23, has resulted in insulator pair 38/41, with openings 45, for the electrically conductive metal.

Figure 4:
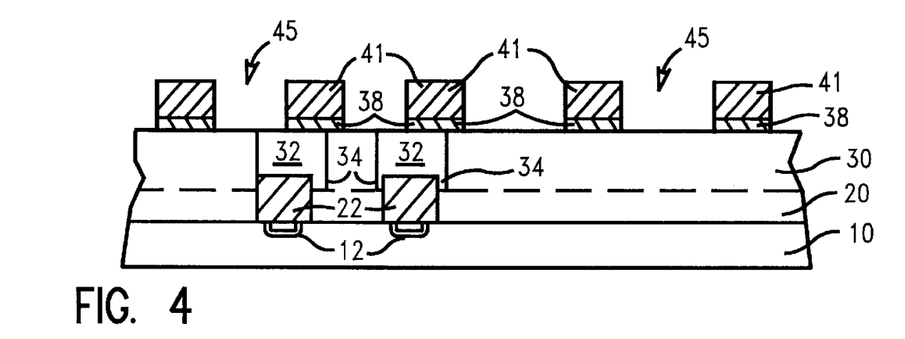
FIG. 4, shows the formation of openings in the first and second insulator layer of FIG. 3, to expose at least a portion of the metallic via stud.

The interconnection pattern for the openings 45, are typically defined photolithographically and insulators 40 and 39, are sequentially etched. The mutually exclusive etch character of each of these insulators 40 and 39, prevents etching of the other insulator while one of them is being etched.

High electrical conductivity metallurgy 43, such as comprised of titanium, titanium-nitride underlayer materials are next deposited into the openings 45. This deposition to form the interconnection line 43, is typically done by sputter deposition, which is followed by the deposition of aluminum, copper, or their alloys, and, any excess metal material can be removed by chemical/mechanical polishing in a singular or in a sequence of multiple polishing steps. One is then left with a metal interconnection pattern 43, which is imbedded and substantially planar with the surface of the surrounding insulator layer 40, as clearly shown in FIG. 5.

The next step is to form interlevel via-plugs and the second level interconnection lines. This could be accomplished either by first forming a planarized set of via-plugs and then forming the second level interconnection lines, or, by simultaneously forming the via-plugs and the interconnection lines by a double damascene method.

It is preferred that at least one metallic via-plug is substantially in coplanarity with at least one of the insulator layer. This will also help in the planarity of the final structure.

Figure 6:
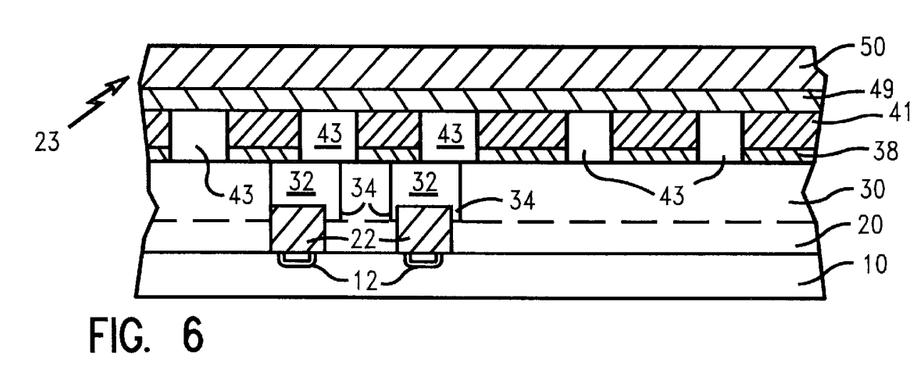
FIG. 6, shows the deposition of a thin layer of a third insulator a thicker layer of a fourth insulator atop the planarized first level interconnection pattern.
Figure 7:
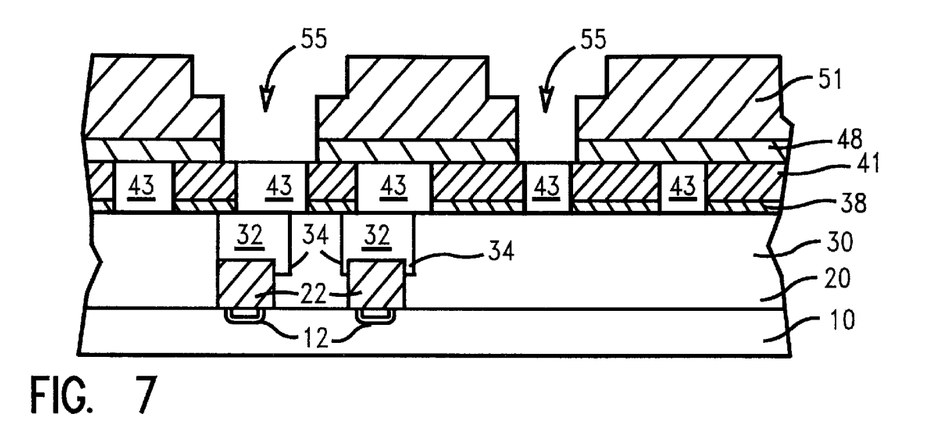
FIG. 7, shows the sequentially etched via-stud and second level of high conductivity interconnection patterns.
Figure 8:
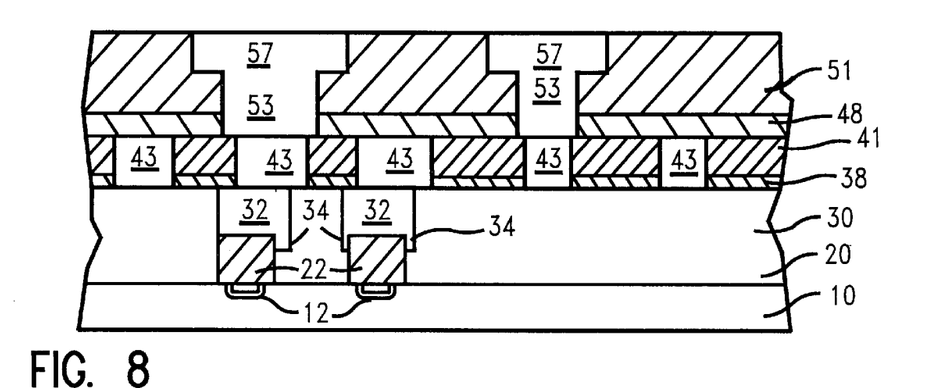
FIG. 8, shows the final structure of the invention comprising of planarized two levels of interconnection lines and via studs without any metal

FIGS. 6, 7 and 8, illustrate the process for the simultaneous formation of the via-plugs and the interconnection lines by using the improved double damascene process of this invention.

While, FIGS. 9, 10, 11, 12 and 13, illustrate the process for forming a planarized set of via-plugs and then forming the second level interconnection lines by using the improved methods of this invention.

Now going back to FIG. 6, which illustrates the use of the improved double damascene process to simultaneously form via-plugs and the second level interconnection lines. A pair of insulators layers 49 and 50, are deposited as shown in FIG. 6. The insulator pair 49 and 50, is deposited by the same process as was done for the insulator pair 23. For best results it is preferred that the thickness of the second insulator 50, typically $SiO_2$, is approximately 25 percent thicker than the combined thickness of the desired via-plug 53, and the desired second level interconnection lines 57, as more clearly shown in FIG. 8.

A pattern corresponding to the desired high conductivity metal interconnection lines of second level and of via-plugs are sequentially defined and the insulators 50 and 49, are sequentially etched.

As shown in FIG. 7, the insulator layers 50 and 49, are etched to create a two step opening 55, in an insulator pair 51/48. The opening 55, is etched until at least a portion of the surface of the 1st metal interconnection 43, is exposed. As stated earlier that the mutually exclusive etch behavior prevents etching of the insulator 41, while insulator 49, is etched to form insulator islands 48.

A sequence of metal liner layers and high electrical conductivity metal is next deposited by any of the deposition methods, such as, for example, CVD (Chemical Vapor Deposition), sputtering, electroplating methods, or any combination of these or other similar methods. Any excess metal materials are removed in a singular or in a sequence of steps, such as, by chemical/mechanical polishing to leave the integrated via-studs 53, and the 2nd level interconnection pattern 57, imbedded in, and substantially planar with, the surrounding insulator 51, as clearly seen in FIG. 8.

In another embodiment of the present invention the interlevel via-plugs are first formed, which is followed by the formation of the second level of interconnection lines. This is achieved by depositing insulator layers, having a total thickness of about 20 percent thicker than the desired length of the via-plugs only; photomasking for via-plug design and etching the insulators sequentially.

The material for the high electrical conductivity via-plug could be selected from a group comprising aluminum, chromium, chromium/chromium-oxide, cobalt, copper, molybdenum, nickel, palladium, platinum, tantalum, tantalum-nitride, titanium, titanium-boride, titanium-nitride, titanium-oxy-nitride, titanium-silicide, titanium-tungsten, tungsten, tungsten-nitride, tungsten-silicon, or an alloy thereof, to name a few.

As stated earlier, FIGS. 9 through 13, illustrate another embodiment of this invention. The process and structure of this alternative embodiment of the invention is the same as shown up to FIG. 6.

Figure 5:
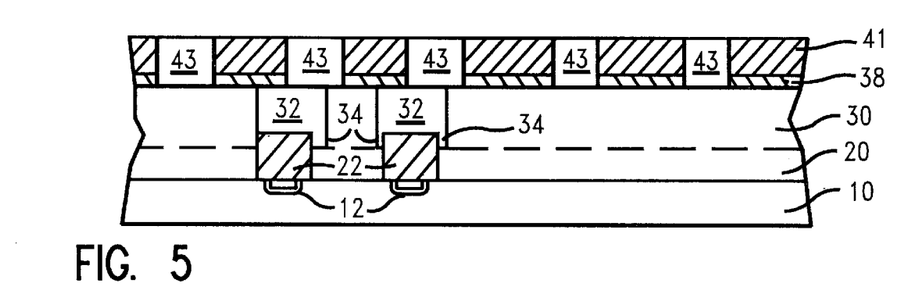
FIG. 5, shows a cross-sectional view after a first level of high electrical conductivity metal interconnection has been deposited inside the opening of FIG. 4.
Figure 9:
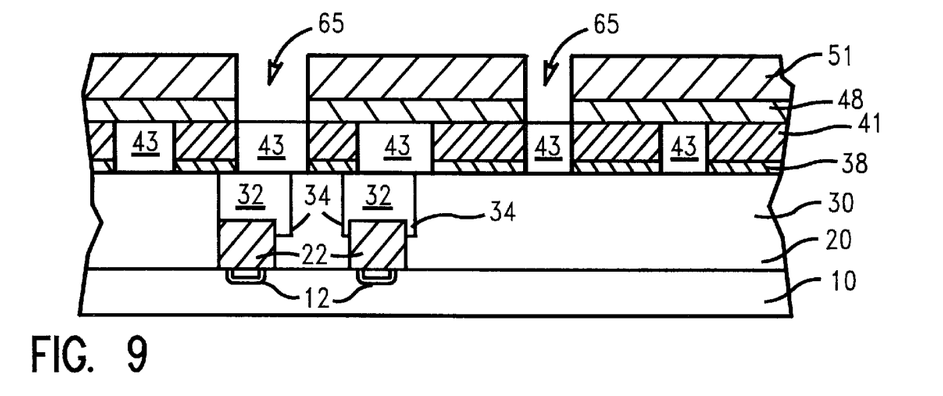
FIGS. 9, 10, 11, 12 and 13, show another embodiment of the invention where via-plugs are formed without causing electrical shorts to below level electrical features, using the process of this invention.

As shown in FIG. 9, a pair of insulators layers 50 and 49, are first deposited, on top of the structure which is shown in FIG. 5, to form a structure which is similar to the one shown in FIG. 6. The insulator layer 50, is first etched to form insulator islands 51, and then insulator layer 49, is etched to form insulator islands 48, thus creating openings 65, as more clearly shown in FIG. 9.

Figure 10:
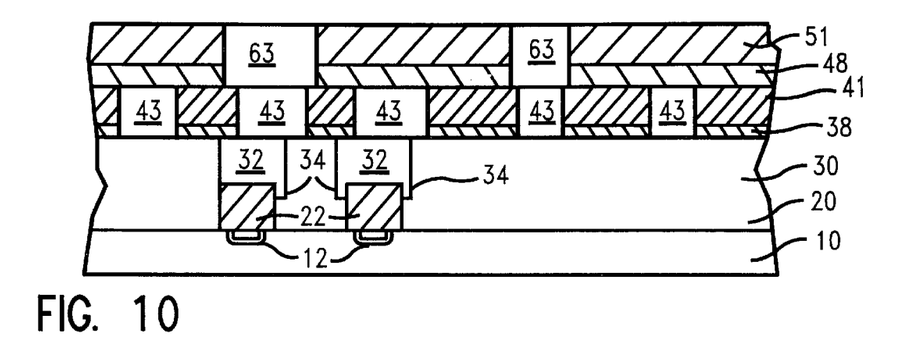
Figure 11:
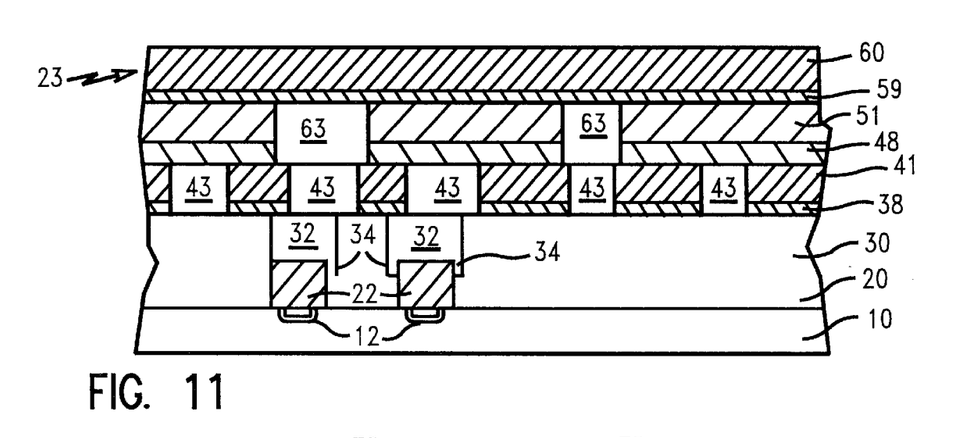

The desired metals for the via-plugs 63, are then deposited into the openings 65, and using suitable methods, such as, chemical/mechanical polishing the excess metals are removed, so that the via-plug 63, is in flush arrangement with the upper surface of the insulator layer 51, as clearly seen in FIG. 10.

The next step in this process is the formation of the second level of high electrical conductivity metal interconnection lines. The insulator pair 59 and 60, is deposited by the same process as was done for the insulator pair 23. For best results it is preferred that the thickness of the second insulator 60, typically $SiO_2$, is approximately 25 percent thicker than the desired second level interconnection lines 73, as more clearly shown in FIG. 13.

A pattern corresponding to the desired high electrical conductivity interconnection line is defined and the insulators 60 and 59, are sequentially etched.

Figure 12:
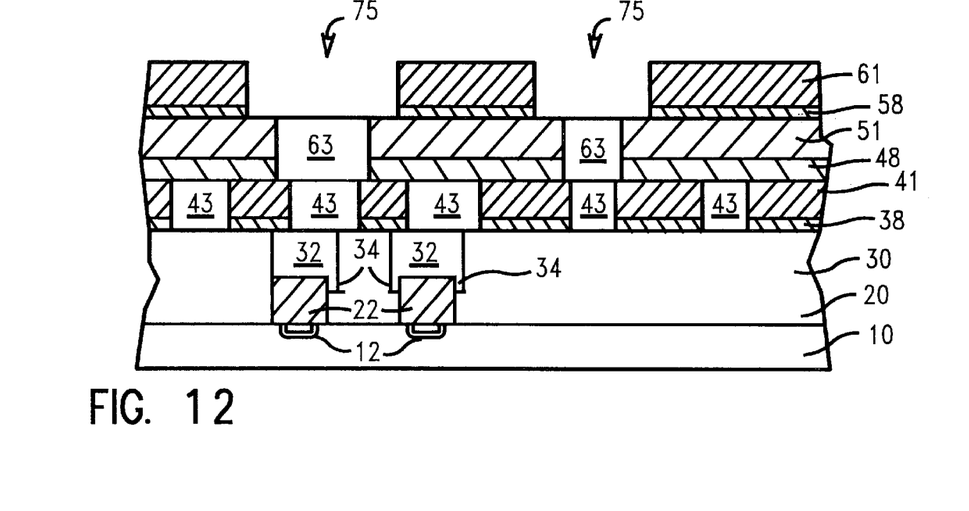
Figure 13:
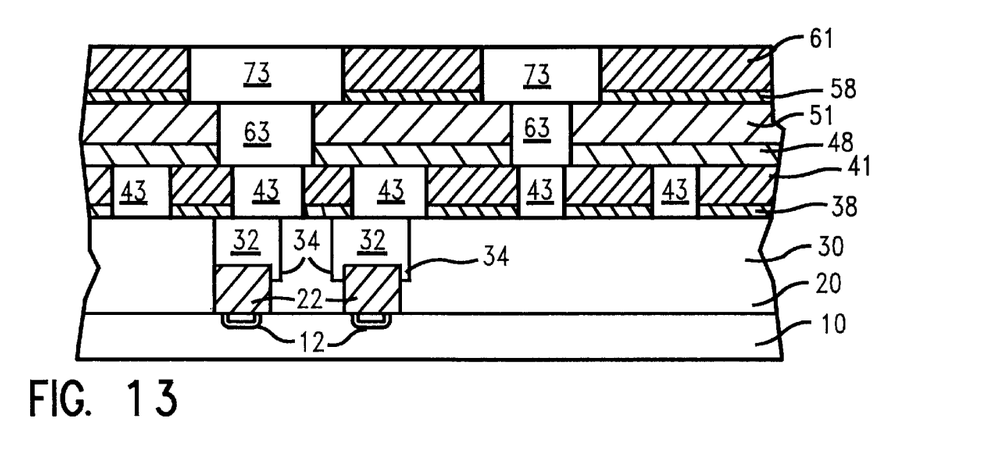

As shown in FIG. 12, the insulator layers 60 and 59, are etched to create at least one opening 75, in an insulator pair 61/58. The opening 75, is etched until at least a portion of the surface of the via-plugs 63, is exposed. As stated earlier that the mutually exclusive etch behavior prevents etching of the insulator 61, while insulator 59, is etched to form insulator islands 58.

A sequence of metal liner layers and high electrical conductivity metal is next deposited by any of the deposition methods, such as, for example, CVD (Chemical Vapor Deposition), sputtering, electroplating methods, or any combination of these or similar methods. Any excess metal materials are removed in a singular or in a sequence of steps, such as, by chemical/mechanical polishing to leave the 2nd level interconnection pattern 73, imbedded in, and substantially planar with, the surrounding insulator 61, as clearly seen in FIG. 13.

One advantage of this method is that the metals for the via-plugs 63, and the second level of interconnection metal lines 73, could be the same or they could be different.

This process is particularly of advantage where the first level of interconnection lines 43, are defined by, say, aluminum-copper alloys, and the desired metal for the second level of interconnection lines 73, is, say, copper, then tungsten or copper, with an optional cladding of aluminum, chromium, chromium/chromium-oxide, cobalt, copper, molybdenum, nickel, palladium, platinum, tantalum, tantalum-nitride, titanium, titanium-boride, titanium-nitride, titanium-silicide, titanium-tungsten, or any combination of them, could be used for via-plugs 63.

Figure 14:
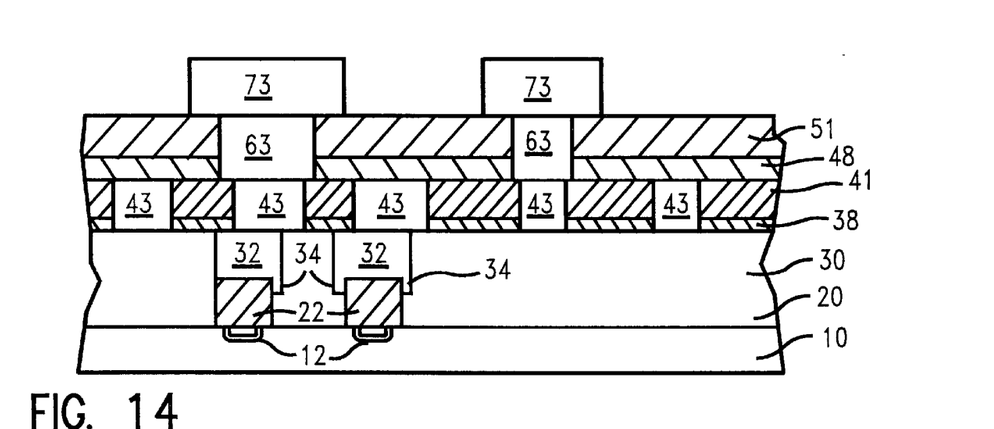
FIG. 14, illustrates a cross-sectional view either of the structure of FIG. 13, after a portion of the insulator surrounding the second level of high electrical conductivity interconnect has been removed, or where the second level of high conductivity electrical interconnection line is formed by a subtractive process.

For some applications it might be desirable to form the interconnection lines 73, by depositing the desired metal layers and reactively ion etching, as more clearly seen in FIG. 14.

It should be apparent that given the guidance and the illustrations set forth herein, alternate embodiments of the processes and structures of the present invention may be suggested to a skilled artisan. For example, the insulator layers may be organic, in-organic or any combination of them and deposited by any, or several, of the known methods. The numbering, first and second level of high electrical conductivity interconnection wiring, is used for the purpose of illustration only and does not bound the use of the present invention to those numbered layers. Likewise, the methods and the materials described for the first and the second level of interconnection wiring can be independently used for defining the circuitry at any desired level of interconnection.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process of forming high electrical conductivity interconnection on a substrate having at least one exposed metallic via-plug surrounded by at least one insulator layer, said process comprising the steps of:
    (a) sequentially depositing at least one first insulator layer over said exposed metallic via-plug and said substrate, and at least one second insulator layer over said first insulator layer, and wherein material for said first insulator layer is different than material for said second insulator layer,
    (b) defining a pattern for a first level of high electrical conductivity interconnection over said second insulator layer,
    (c) etching at least a portion of said second insulator layer with a first etchant such that at least a portion of said first insulator layer is exposed, and etching at least a portion of said exposed first insulator layer with a second etchant so as to form at least one opening and to expose at least a portion of said metallic via-plug, and wherein material for said first and said second insulator is chosen so as to provide mutually exclusive etching behavior,
    (d) depositing at least one high electrical conductivity interconnection to form said first level of high electrical conductivity interconnection within said at least one opening, such that at least a portion of said high electrical conductivity interconnection is in direct electrical contact with at least a portion of said metallic via-plug, and thereby forming said high electrical conductivity interconnection on said substrate.

2. The process of claim 1, wherein said high electrical conductivity interconnection comprises of at least one layer of a contact metal, a barrier metal and a high conductivity metal.

3. The process of claim 2, wherein said contact metal is titanium, tantalum or an alloy thereof.

4. The process of claim 2, wherein said barrier material is selected from a group consisting of chromium, chromium/chromium-oxide, tantalum, tantalum-nitride, titanium-nitride, titanium-oxy-nitride, tungsten, tungsten-nitride, tungsten-silicon or an alloy thereof.

5. The process of claim 2, wherein said high conductivity metal is selected from a group consisting of aluminum, aluminum-copper, copper, copper-tin, copper-hafnium, copper-lanthanum, copper-zirconium, gold, silver or alloys thereof.

6. The process of claim 2, wherein said high electrical conductivity interconnection has at least one cap layer, and wherein said cap layer is selected from a group consisting of chromium, tantalum, tantalum nitride, titanium, titanium nitride, tungsten, tungsten nitride, tungsten silicon and alloys thereof.

7. The process of claim 1, wherein said at least one exposed metallic via-plug surrounded by said at least one insulator layer is planarized prior to step (a).

8. The process of claim 1, wherein said deposition step is done using a technique selected from a group consisting of sputtering, collimated sputtering, low pressure sputtering, reactive sputtering, chemical vapor deposition, electroplating and evaporation.

9. The process of claim 1, wherein said pattern in step (b) is defined using photolithography.

10. The process of claim 1, wherein material for said first insulator layer is selected from a group consisting of aluminum-oxide, magnesium-oxide, silicon-nitride, silicon-oxide and yttrium-oxide.

11. The process of claim 1, wherein material for said second insulator is selected from a group consisting of silicon-oxide, phospho-silicate glass and polyimide.

12. The process of claim 1, wherein etch chemistry for said first insulator layer is different than etch chemistry for said second insulator layer.

13. The process of claim 1, wherein material for said metallic via-plug is selected from a group consisting of molybdenum, titanium, tungsten and alloys thereof.

14. A process of forming multilevel high electrical conductivity interconnection on a substrate having at least one exposed metallic via-plug surrounded by at least one insulator layer, said process comprising the steps of:

(a) sequentially depositing, at least one first insulator layer over said exposed metallic via-plug and said substrate, and at least one second insulator layer over said first insulator layer, and wherein material for said first insulator layer is different than material for said second insulator layer, (b) defining a pattern for a first level of high electrical conductivity interconnection over said second insulator layer, (c) etching at least a portion of said second insulator layer with a first etchant such that at least a portion of said first insulator layer is exposed, and etching at least a portion of said exposed first insulator layer with a second etchant so as to form at least one opening and to expose at least a portion of said metallic via-plug, and wherein material for said first and said second insulator is chosen so as to provide mutually exclusive etching behavior, (d) depositing at least one first high electrical conductivity material to form said first level of high electrical conductivity interconnection line within said at least one opening, such that at least a portion of said first high electrical conductivity interconnection line is in direct contact with at least a portion of said metallic via-plug, (e) sequentially depositing, at least one third insulator layer over said first level of high electrical conductivity interconnection line and said second insulator, and at least one fourth insulator layer over said third insulator layer, and wherein material for said third insulator layer is different than material for said second and said fourth insulator layer, (f) defining a pattern corresponding to at least one first level of high electrical conductivity via-plug over said fourth insulator layer, (g) etching at least a portion of said fourth insulator layer, (h) defining a pattern corresponding to at least one second level of high electrical conductivity metal interconnection line over said fourth insulator layer, (i) sequentially etching at least a portion of said fourth insulator layer, and at least a portion of said third insulator layer, to form at least one combined opening for at least one first level of high electrical conductivity via-plug and at least one second level of high electrical conductivity metal interconnection line, and exposing at least a portion of said first level of high electrical conductivity metal interconnection line, (j) depositing at least one high electrical conductivity interconnection to form an integrated interconnection structure comprised of said first level of high electrical conductivity via-plug and said second level of high electrical conductivity interconnection line within said at least one opening, such that at least a portion of said high electrical conductivity interconnection via-plug is in direct contact with at least a portion of said high electrical conductivity metal interconnection line, and thereby forming said multilevel high electrical conductivity via-plug and interconnection line on said substrate.

15. The process of claim 14, wherein material for said first high electrical conductivity interconnection is the same as material for said second high electrical conductivity interconnection.

16. The process of claim 14, wherein material for said first high electrical conductivity interconnection is different than the material for said second high electrical conductivity interconnection.

17. The process of claim 14, wherein said high electrical conductivity interconnection comprises of at least one layer of a contact metal, a barrier metal and a high conductivity metal.

18. The process of claim 17, wherein said contact metal is titanium, tantalum or an alloy thereof.

19. The process of claim 17, wherein said barrier material is selected from a group consisting of chromium, chromium/chromium-oxide, cobalt, nickel, palladium, platinum, tantalum, tantalum-nitride, titanium-boride, titanium-nitride, titanium-oxy-nitride, titanium-silicide, titanium-tungsten, tungsten, tungsten-nitride, tungsten-silicon or an alloy thereof.

20. The process of claim 17, wherein said high conductivity metal is selected from a group consisting of aluminum, aluminum-copper, copper, copper-tin, copper-hafnium, copper-lanthanum, copper-zirconium, gold, silver or alloys thereof.

21. The process of claim 17, wherein said high electrical conductivity interconnection has at least one cap layer, and wherein said cap layer is selected from a group consisting of chromium, tantalum, tantalum nitride, titanium, titanium nitride, tungsten, tungsten nitride, tungsten silicon and alloys thereof.

22. The process of claim 14, wherein said at least one exposed metallic via-plug surrounded by said at least one insulator layer is planarized prior to step (a).

23. The process of claim 14, wherein said deposition step is done using a technique selected from a group consisting of sputtering, collimated sputtering, low pressure sputtering, reactive sputtering, chemical vapor deposition, electroplating and evaporation.

24. The process of claim 14, wherein said pattern is defined using photolithography.

25. The process of claim 14, wherein material for said first and/or third insulator layer is selected from a group consisting of silicon-nitride, magnesium-oxide, yttrium-oxide and aluminum-oxide.

26. The process of claim 14, wherein material for said second and/or fourth insulator is selected from a group consisting of silicon-oxide, phospho-silicate glass and polyimide.

27. The process of claim 14, wherein etch chemistry for said first and/or third insulator layer is different than etch chemistry for said second and/or fourth insulator layer.

28. The process of claim 14, wherein material for said metallic via-plug is selected from a group consisting of molybdenum, titanium, tungsten and alloys thereof.

29. A process of forming multilevel high electrical conductivity interconnection, comprised of via-plug and interconnection lines, on a substrate having at least one exposed metallic via-plug surrounded by at least one insulator layer, said process comprising the steps of:

(a) sequentially depositing, at least one first insulator layer over said exposed metallic via-plug and said substrate, and at least one second insulator layer over said first insulator layer, and wherein material for said first insulator layer is different than material for said second insulator layer, (b) defining a pattern for a first level of high electrical conductivity interconnection over said second insulator layer, (c) etching at least a portion of said second insulator layer with a first etchant such that at least a portion of said first insulator layer is exposed, and etching at least a portion of said exposed first insulator layer with a second etchant so as to form at least one opening and to expose at least a portion of said metallic via-plug, and wherein material for said first and said second insulator is chosen so as to provide mutually exclusive etching behavior, (d) depositing at least one high electrical conductivity material to form said first level of high electrical conductivity interconnection line within said at least one opening, such that at least a portion of said first high electrical conductivity interconnection line is in direct contact with at least a portion of said metallic via-plug, (e) sequentially depositing, at least one third insulator layer over said first level of high electrical conductivity interconnection line and said second insulator layer, and at least one fourth insulator layer over said third insulator layer, and wherein material for said third insulator layer is different than material for said second and said fourth insulator layer, (f) defining a pattern corresponding to at least one first level of high electrical conductivity via-plug over said fourth insulator layer, (g) sequentially etching at least a portion of said fourth insulator layer, and at least a portion of said third insulator layer, to form at least one opening and to expose at least a portion of said first level of high electrical conductivity interconnection line, (h) depositing at least one high electrical conductivity material to form said first level of high electrical conductivity via-plug within said at least one opening, such that at least a portion of said first level of high electrical conductivity via-plug is in direct contact with at least a portion of said first level of high electrical conductivity interconnection line, (i) sequentially depositing, at least one fifth insulator layer over said first level of high conductivity via-plug and said fourth insulator layer, and at least one sixth insulator layer over said fifth insulator layer, and wherein material for said fifth insulator material is different than material for said fourth and said sixth insulator layer, (j) defining a pattern for at least one second level of high electrical conductivity interconnection line over said sixth insulator layer, (k) sequentially etching at least a portion of said sixth and fifth insulator layer, to form at least one opening and to expose at least a portion of said second level of high electrical conductivity interconnection line, (l) depositing at least one high electrical conductivity material to form said second level of high electrical conductivity interconnection line within said at least one opening, such that at least a portion of said second level of high electrical conductivity interconnection line is in direct contact with at least a portion of said first high electrical conductivity via-plug, and thereby forming said multilevel high electrical conductivity interconnection on said substrate.

30. A process of forming multilevel high electrical conductivity interconnection, comprised of via-plug and interconnection lines, on a substrate having at least one exposed metallic via-plug surrounded by at least one insulator layer, said process comprising the steps of:

(a) sequentially depositing, at least one first insulator layer over said exposed metallic via-plug and said substrate, and at least one second insulator layer over said first insulator layer, and wherein material for said first insulator layer is different than material for said second insulator layer, (b) defining a pattern for a first level of high electrical conductivity interconnection over said second insulator layer, (c) etching at least a portion of said second insulator layer with a first etchant such that at least a portion of said first insulator layer is exposed, and etching at least a portion of said exposed first insulator layer with a second etchant so as to form at least one opening and to expose at least a portion of said metallic via-plug, and wherein material for said first and said second insulator is chosen so as to provide mutually exclusive etching behavior, (d) depositing at least one high electrical conductivity material to form said first level of high electrical conductivity interconnection line within said at least one opening, such that at least a portion of said first high electrical conductivity interconnection line is in direct contact with at least a portion of said metallic via-plug, (e) sequentially depositing, at least one third insulator layer over said first level of high electrical conductivity interconnection line and said second insulator layer, and at least one fourth insulator layer over said third insulator layer, and wherein material for said third insulator layer is different than material for said second and said fourth insulator layer, (f) defining a pattern corresponding to at least one first level of high electrical conductivity via-plug over said fourth insulator layer, (g) sequentially etching at least a portion of said fourth insulator layer, and at least a portion of said third insulator layer, to form at least one opening and to expose at least a portion of said first level of high electrical conductivity interconnection line, (h) depositing at least one high electrical conductivity material to form said first level of high electrical conductivity via-plug within said at least one opening, such that at least a portion of said first level of high electrical conductivity via-plug is in direct contact with at least a portion of said first level of high electrical conductivity interconnection line, (i) depositing at least one high electrical conductivity material over said fourth insulator layer and said first level of high electrical conductivity via-plug, such that said material is in electrical contact with at least a portion of said first high electrical conductivity via-plug, (l) defining a pattern for at least one second level of high electrical conductivity interconnection line, (k) reactively ion etching said defined pattern to form said second level of high electrical conductivity interconnection line, and thereby forming said multilevel high electrical conductivity interconnection on said substrate.

* * * * *